US007742315B2

(12) United States Patent
Becker et al.

(10) Patent No.: US 7,742,315 B2
(45) Date of Patent: Jun. 22, 2010

(54) CIRCUIT ON A PRINTED CIRCUIT BOARD

(75) Inventors: Wiren D. Becker, Hyde Park, NY (US);
Bruce J. Chamberlin, Vestal, NY (US);
Gerald J. Fahr, Wappingers Falls, NY (US); Roland Frech, Ostfildern (DE);
Dierk Kaller, Schoenaich (DE); George Katopis, Poughkeepsie, NY (US); Erich Klink, Schoenaich (DE);
Thomas-Michael Winkel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 839 days.

(21) Appl. No.: 11/282,041

(22) Filed: Nov. 17, 2005

(65) Prior Publication Data

US 2007/0111576 A1    May 17, 2007

(51) Int. Cl.
*H05K 1/11* (2006.01)
*H05K 1/14* (2006.01)
(52) U.S. Cl. .................. 361/794; 361/792; 361/795
(58) Field of Classification Search .......... 361/792–795
See application file for complete search history.

(56) References Cited

U.S. PATENT DOCUMENTS

| 6,084,779 | A * | 7/2000 | Fang ..................... 361/763 |
| 6,198,362 | B1 * | 3/2001 | Harada et al. .............. 333/12 |
| 6,900,992 | B2 * | 5/2005 | Kelly et al. ................ 361/794 |
| 7,068,518 | B2 * | 6/2006 | Ueno et al. ................ 361/760 |
| 7,091,571 | B1 * | 8/2006 | Park et al. .................. 257/432 |
| 7,235,457 | B2 * | 6/2007 | Forbes et al. ............... 438/422 |
| 7,355,125 | B2 * | 4/2008 | Becker et al. .............. 174/255 |

OTHER PUBLICATIONS

T.J. Slegel et al. "The IBM eServer z990 Microprocessor", IBM Journal of Research and Development, vol. 48, No. 3/4, May/Jul. 2004, pp. 295-309.
G. Gerwig et al. "The IBM eServer z990 Floating-Point Unit", IBM Journal of Research and Development. vol. 48, No. 3/4, May/Jul. 2004, pp. 311-322.
P. Mak et al. "Processor Subsystem Interconnect Architecture for a Large Symmetric Multiprocessing System", IBM Journal of Research and Development, vol. 48, No. 3/4, May/Jul. 2004, pp. 323-337.

(Continued)

*Primary Examiner*—Tuan T Dinh
(74) *Attorney, Agent, or Firm*—Steven Chiu

(57) ABSTRACT

The present invention relates to computer hardware design, and in particular to a printed circuit board (card) comprising wiring dedicated to supply electric board components such as integrated circuits with at least three different reference planes. In particular at locations, where the pins of a card-to-card connector enter the layer structure of the card discontinuities brake the high frequency signal return path of a given signal wiring.

In order to close the signal return path around a signal path from card to card including the connector, and thus to limit the signal coupling while concurrently keeping the card design as simple as possible, it is proposed to provide
a) an additional capacitance for a given signal wiring in a discontinuity section,
b) wherein the additional capacitance is formed by a voltage island placed within a signal layer located next to the given signal wiring.

4 Claims, 8 Drawing Sheets

OTHER PUBLICATIONS

T. Webel et al. "Run-Control Migration from Single Book to Multibooks", IBM Journal of Research and Development, vol. 48, No. 3/4, May/Jul. 2004, pp. 339-346.

D.G. Bair et al. "Functional Verification of the z990 Superscalar, Multibook Microprocessor Complex", IBM Journal of Research and Development, vol. 48, No. 3/4, May/Jul. 2004, pp. 347-365.

H. W. Anderson et al. "Configurable System Simulation Model Build Comprising Packaging Design Data", IBM Journal of Research and Development, vol. 48, No. 3/4, May/Jul. 2004, pp. 367-378.

T. M. Winkel et al. "First- and Second-Level Packaging of the z990 Processor Cage", IBM Journal of Research and Development, vol. 48, No. 3/4, May/Jul. 2004, pp. 379-394.

J. C. Parrilla et al. "Packaging the IBM eServer z990 Central Electronic Complex", IBM Journal of Research and Development, vol. 48, No. 3/4, May/Jul. 2004, pp. 395-407.

G. F. Goth et al. "Hybrid Cooling With Cycle Steering in the IBM eServer z990", IBM Journal of Research and Development, vol. 48, No. 3/4, May/Jul. 2004, pp. 409-423.

L. C. Heller "Millicode in an IBM zSeries Processor", IBM Journal of Research and Development, vol. 48, No. 3/4, May/Jul. 2004, pp. 425-434.

C. Axnix et al. "z990 NetMessage-Protocol-Based Processor to Support Element Communication Interface", IBM Journal of Research and Development, vol. 48, No. 3/4, May/Jul. 2004, pp. 435-447.

W.E. Chencinski et al. "The Structure of Chips and Links Comprising the IBM eServer z990 I/O Subsystem", IBM Journal of Research and Development, vol. 48, No. 3/4, May/Jul. 2004, pp. 449-459.

B. Hoppe "Functional Verification of a Frequency-Programmable Switch Chip with Asynchronous Clock Sections", IBM Journal of Research and Development, vol. 48, No. 3/4, May/Jul. 2004, pp. 461-474.

T. W. Arnold et al. "The IBM PCIXCC: A New Cryptographic Coprocessor for the IBM eServer", IBM Journal of Research and Development, vol. 48, No. 3/4, May/Jul. 2004, pp. 475-487.

L. W. Wyman et al. "Multiple-Logical-Channel Subsystems: Increasing zSeries I/O Scalability and Connectivity", IBM Journal of Research and Development, vol. 48, No. 3/4, May/Jul. 2004, pp. 489-505.

G. Banzhaf et al. "SCSI Initial Program Loading for zSeries", IBM Journal of Research and Development, vol. 48, No. 3/4, May/Jul. 2004, pp. 507-518.

M. L. Fair et al. "Reliability, Availability, and Serviceability (RAS) of the IBM eServer z990", IBM Journal of Research and Development, vol. 48, No. 3/4, May/Jul. 2004, pp. 519-534.

I. G. Siegel et al. "Logical partition Mode Physical Resource Management on the IBM eServer z990", IBM Journal of Research and Development, vol. 48, No. 3/4, May/Jul. 2004, pp. 535-541.

W. Gellerich et al. "The GNU 64-Bit PL8 Compiler: Toward an Open Standard Environment for Firmware Development", IBM Journal of Research and Development, vol. 48, No. 3/4, May/Jul. 2004, pp. 543-556.

S. Koerner et al "The z990 First Error Data Capture Concept", IBM Journal of Research and Development, vol. 48, No. 3/4, May/Jul. 2004, pp. 557-567.

K. D. Schubert et al. "Accelerating System Integration by Enhancing Hardware, Firmware, and Co-Simulation", IBM Journal of Research and Development, vol. 48, No. 3/4, May/Jul. 2004, pp. 569-581.

M. Stetter et al "IBM eServer z990 Improvements in Firmware Simulation", IBM Journal of Research and Development, vol. 48, No. 3/4, May/Jul. 2004, pp. 583-594.

* cited by examiner

| MEASURED COUPLED NOISE [mV] | CASE 1 | CASE 2 | CASE 3 |
|---|---|---|---|
| NEAR END | 74 | 67 | 272 |
| FAR END | 14 | 16 | 165 |

CIRCUIT ON A PRINTED CIRCUIT BOARD

BACKGROUND OF THE INVENTION

1. Field of the Invention

The present invention relates to computer hardware design, and in particular to a printed circuit board connector circuit for arrangement between two printed circuit boards, said connector circuit comprising wiring dedicated to supply electric board components such as integrated circuits with at least three different reference planes.

2. Description and Disadvantages of Prior Art

A prior art connective device between two printed circuit boards is depicted schematically and in a simplified way in FIG. 1. Details follow later below.

Such printed circuit boards are also referred to herein as "cards". The present invention will be defined from prior art by referencing a card connector between a mother card and a daughter card as this relates to common practice.

In complex computer systems there is the need to supply a card with more than two voltage levels as represented by the nominal supply voltage and ground, but instead very often, a third voltage level V3 or even more voltage levels are needed to be implemented at the card. Signal wiring and voltage supply are often arranged in separate planes, and a card has a sandwich-like plane structure, wherein vias connect between different planes. Further, those voltages represent a voltage reference in relation to signal wiring, so the voltage planes are referred to herein also as reference planes.

Those reference planes are metallization planes which implement often one ground and two different voltage levels, often denoted as GROUND, Vdd and V3, thus e.g. GND=0 Volt, Vdd=1.8 Volt, and for example an intermediate voltage level V3 as e.g., V3=1.5 Volt.

With reference to the very focus of the present invention it is useful to make a distinction between different packaging levels, like Chip level, Multi Chip Modules (MCM), MCM connectors, card levels, card connectors, back plane boards, where different electrical situations prevail, but which must be electrically connected to each other for operation.

Further packaging levels are for instance (in a bottom up view): The chip as a zero packaging level, chip-module as a first packaging level, cards (so called printed wiring boards) carrying different multiple chip-modules as a second packaging level, or so called mother boards carrying different card connectors with daughter cards as a third level package.

When connecting two cards, i.e., two printed circuit boards of complex computer systems, a lot of performance critical high-frequency signals thus do not stay within one and the same packaging level.

More particularly, and with reference to FIG. 1 a first card 110 is shown connected to a second card 118 by aid of a connector device 111. A signal line 115 is depicted to cross from the first card 110 via the connector 111 to the second card 118. The same is true for a ground line 116 and a supply voltage line 117 and a further voltage line 119, having the voltage level denoted as V3.

Signals like that one depicted as signal 115 often pass the above-mentioned different packaging levels and components. In each of the packaging levels and components the signal is referenced to voltage and ground layers, pins or plated through-holes, abbreviated as PTH, adjacent to them. This is depicted in FIG. 1 symbolically with signal 115 and adjacent ground pin 116 and voltage pin 119.

In different cards and connectors the voltage level acting as a signal reference can vary, due to the need to distribute different voltage levels inside the cards and system, i.e., within the sandwich layer structure of the cards.

Cost-driven card and system designs often need special design solutions in order to find a trade-off between cost and the optimum electrical design. Therefore, so-called connector shields in the signal area are not only used as a signal high-frequency return current reference, but also as a current distribution for different voltage levels. Thus, signals 115 may have different references in mother card 110 and daughter card 118 as well as in the connector 111. Due to these discontinuities signal coupling, i.e. the so-called crosstalk, will disadvantageously increase dramatically.

With further reference to a publication in IBM Journal of Research and Development, Vol. 48, No. 3/4, published May, July 2004 and FIGS. 2, 3, 4 and 5 (table representation) three exemplary cases of a card-to-card connections are given having different electrical properties in terms of the before-mentioned high-frequency crosstalk problems. In the above publication the technological background for this problem is discussed.

In order to demonstrate the effects of non ideal high frequency signal return path measurements are disclosed performed on a special card test vehicle consisting of two cards connected with a card connector.

FIG. 2 (case 1) is a partly cross sectional view including a multi layer structure illustrating a signal wiring 35 from a more top layer to a more bottom layer, crossing the intermediate layers by a via (depicted as vertical line), illustrating the schematics of the electro-magnetic field around the signal wiring and the associated high frequency signal return path in the layers adjacent to the signal wire, in an ideal case, wherein the signal wiring 35 is embedded always between two power planes; these could also be two ground planes. Here the return path is basically closed all over the signal 35 travel from card 1, over the via of the connector until reaching card 2, as the signal is embedded always by the same voltage reference (either Ground, or Power).

FIG. 3 (case 2) is a depiction according to FIG. 2 including a voltage plane 32 separating signal line 35 and an additional signal wiring 36 in the card 2 portion. In the top portion of card 1 the same good closing of the return path is achieved.

In the bottom portion of card 2 however, the signal 36 is embedded between a ground plane 20 and a voltage plane 30. This implies a return path for signal 35 which is slightly worse than in FIG. 2.

FIG. 4 is a depiction according to FIG. 3 but including a floating pin 40 and illustrating a "worst" case high frequency signal return path for signal 35. Floating can be assumed to occur due to the fact that pin 40 is connected to a reference voltage or to Ground in a quite long distance only. From this floating state a high noise coupling results from signal line 35 to signal line 36 within a discontinuity region within a circle 42 depicted by a broken line. The exact results are given in the table of FIG. 5. Near end is understood to be within card 1, and far end is within card 2.

Measurements performed for the case 2 prove that the high frequency return is nearly as good as for the ideal case 1.

In contrast to that, measurements performed for the case 3 show a significant increase of coupled noise.

In case 3 the floating pin 40 is not connected to any reference plane in card 1 or 2. Therefore the high frequency return current in all other adjacent pins will be increased and thus signal coupling will be increased, if the next neighbouring pins are signal pins. In table 1 the near and far end coupling is depicted for all three cases. In comparison, while the differences in coupling in cases 1 and 2 are negligible, the coupling increases significantly in case 3 by a factor of 4 (near end) and 10 . . . 11 for the far end. Usually, a floating pin 40 is not used in the system design. From a high frequency return path of view, however, a connector pin connected to a voltage or ground plane far away from the internal signal wire connected to the signal pin behaves like a floating pin. This means with increasing distance of the pin (carrying the high frequency return signal) to the power/ground connection, the signal coupling will also increase.

A further printed circuit board structure is disclosed by incorporation in a product sold by IBM, available under IBM eServer zSeries z990 discloses the technical context illustrated in FIGS. 6 and 7. In this publication so-called soft switches are mentioned which are used to drive down the card voltage, when the card has to be replaced in a running system or to prevent cards from being damaged or from malfunctions caused by "over-current". The soft switch separates the card 1 internal voltage 2, FIG. 6, from the source voltage 1 in card 2. The high frequency return path of the signal path—when passing from card 1 to card 2—is said to be broken, which would result in an increased signal coupling. In order to limit the signal coupling it is disclosed to add a second voltage plane as shown in prior art FIG. 7. Thus, a complete plane pair exists having a level of voltage 1 an voltage 2, respectively, which is said to limit the impedance mismatch and the signal-to-signal coupling at the card discontinuity and to provide a good high frequency signal return path due to an efficient internal plane capacitance. This solution is, however, not applicable for cost-driven card designs as the additional plane increases the costs.

It is thus desired to close the high frequency signal return path around a signal path 115 from card to card including the connector, in order to limit the signal coupling while concurrently keeping the card design as simple as possible.

OBJECTIVES OF THE INVENTION

It is thus an objective of the present invention to provide a card-to-card connection offering an improved signal return path for the signal pins within the connector and the cards.

SUMMARY AND ADVANTAGES OF THE INVENTION

This objective of the invention is achieved by the features stated in enclosed independent claims. Further advantageous arrangements and embodiments of the invention are set forth in the dependant claims. Reference should now be made to the appended claims.

In short words, in order to minimize the discontinuity and thus the signal coupling effect in the connector area, a capacitance that is effective for high frequencies has to be provided next to the discontinuity.

A capacitance effective for high frequencies can basically be provided by internal power—ground, power—power or ground—ground planes adjacent to each other. Proposed as most effective are plane pairs with a minimum distance located near the signal line. When different voltages are assigned to different connector shields, multiple plane pairs are needed to close the high frequency return current. This solution will limit the fan out capability of the signals. In order to increase the fan-out capability in different signal layers it is thus proposed for cost-driven card designs to provide so-called "voltage islands" (see reference sign 625 in FIG. 6) added in unused signal layer areas as close as possible to a current signal layer. This close position is very often the next adjacent signal layer. These voltage islands will increase the internal plane-to-plane capacitance and thus will help to close the high frequency return current path, especially at locations where the pins of a card-to-card connector enter the layer structure of the card discontinuities brake the high frequency signal return path of a given signal wiring.

According to the broadest aspect of the invention thus a printed circuit board connector circuit for arrangement between two printed circuit boards is disclosed, wherein the connector circuit comprises wiring dedicated to supply electric board components such as integrated circuits with at least three different reference planes, for example one ground and two voltage levels Ground, Vdd, and V3, which is characterized by:

a) providing for a given signal wiring an additional capacitance in a discontinuity section, wherein the discontinuity is characterized by a more or less broken high-frequency return path of the signal wiring, and b) wherein the additional capacitance is formed by a voltage island placed within the signal layer located next to the given signal wiring.

Preferably, the given signal wiring is embedded within a plane pair of reference planes which can be either voltage or ground, and the next signal layer is located immediately next to one of those reference planes.

Preferably, the voltage island is provided both, in the next upper layer and the next lower layer adjacent to a respective one of said reference planes. Thus the advantageous effect is doubled, as it is effective in both directions.

Preferably, the size of a voltage island is dimensioned such that it is large enough in order to enable the electrical field surrounding the given signal wiring to be large enough to generate the return current.

BRIEF DESCRIPTION OF THE DRAWINGS

The present invention is illustrated by way of example and is not limited by the shape of the figures of the drawings in which.

DETAILED DESCRIPTION OF THE PREFERRED EMBODIMENT

Figure 1:
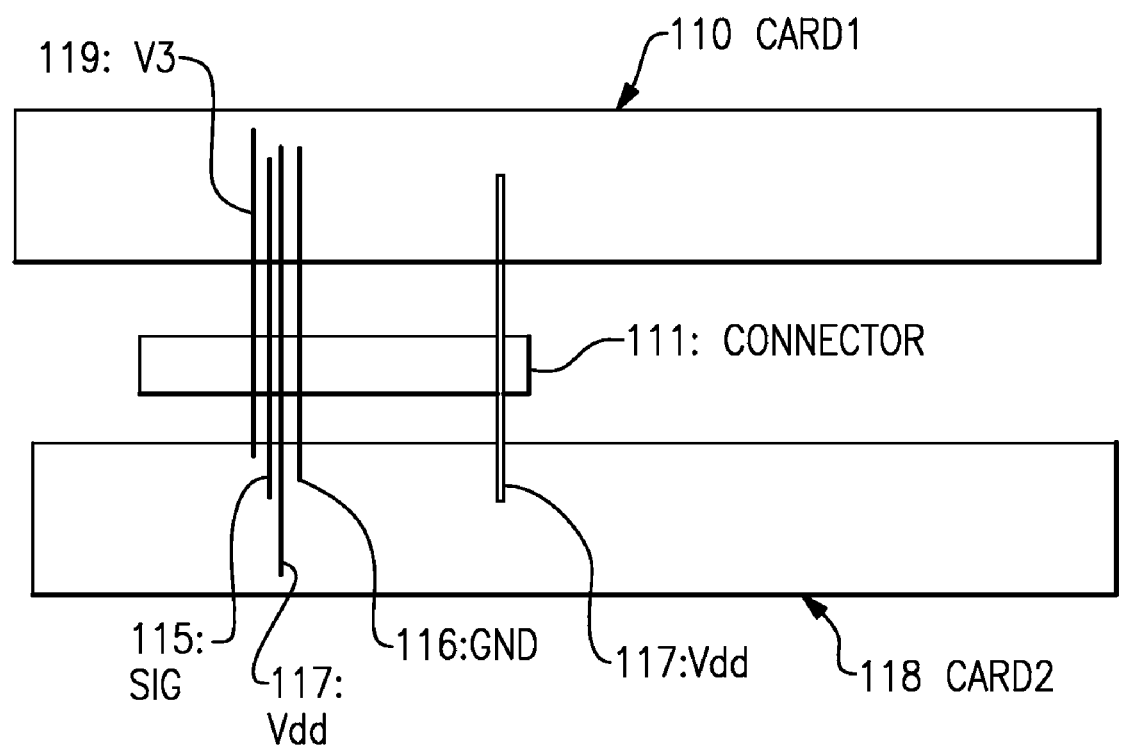
FIG. 1 is a simplified, schematic representation illustrating the structural elements present when two Printed Circuit Boards (PCB) i.e. cards, are connected by aid of a card connector device.
Figure 2:
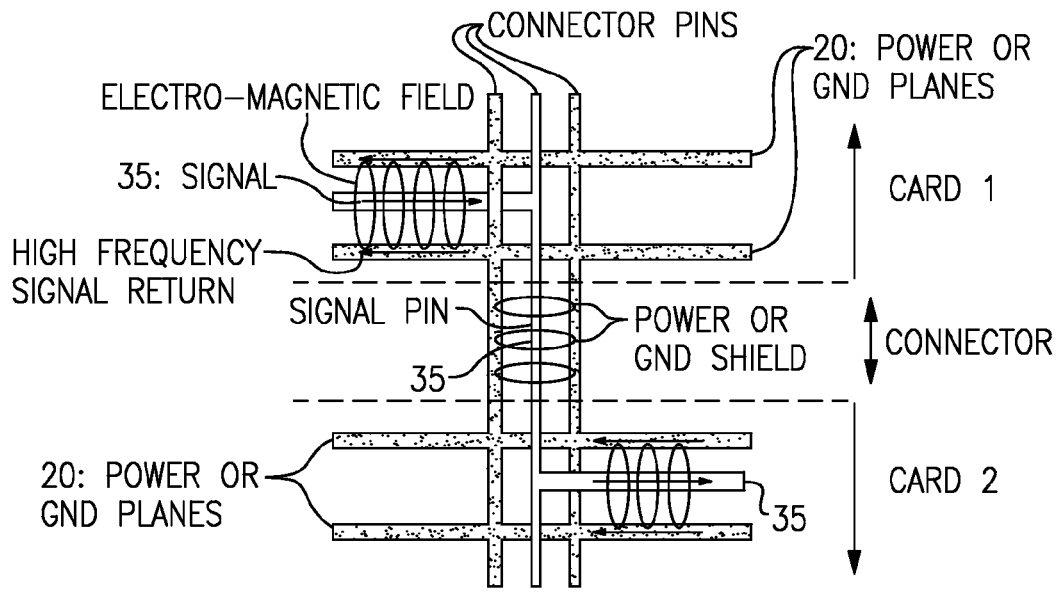
FIG. 2 is a partly cross sectional view including a multi layer structure as given in FIG. 1 and FIG. 2 and illustrating a signal wiring from a more top layer to a more bottom layer, crossing the intermediate layers by a via, illustrating the schematics of the electro-magnetic field around the signal wiring and the associated high frequency signal return path in the layers adjacent to the signal wire, in an ideal case.
Figure 3:
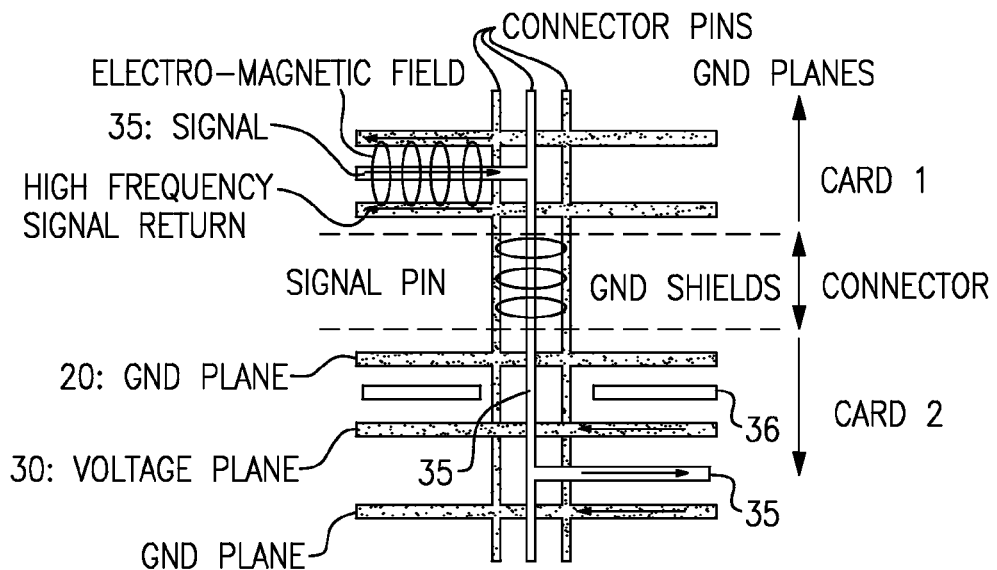
FIG. 3 is a depiction according to FIG. 5 including a voltage plane and an additional signal plane.
Figure 8:
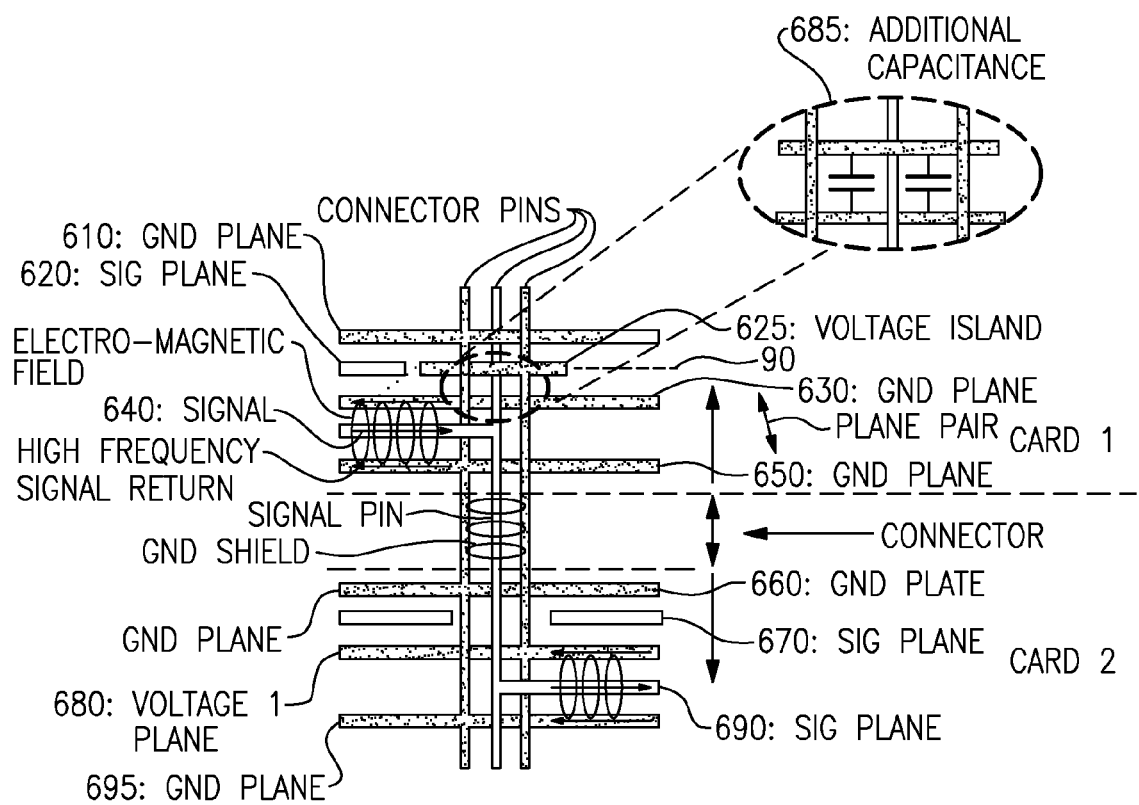
FIG. 8 is a schematic representation of a signal path from a first card into the second card using a connector device with pins and matching pin holes, in a partial view focussing a single signal wiring and adjacent Ground shield and an voltage shield in a connector circuit as well as a voltage plane in card 2 and an additional voltage island in a signal layer in card 1 implemented according to a preferred embodiment of the present invention.

With general reference to the figures and with special reference now to FIG. 8 a ground plane 610 is provided within card 1. Card 1 basically corresponds to card 110 in FIG. 1, card 2 corresponds to card 118 in FIG. 1 and the same applies to connector 111 in FIG. 1 and the connector depicted in FIG. 6. In more detail, the most bottom layer in card 1 remains to be a ground plane, here ground plane 650. Above this ground plane 650 a signal layer 640 is provided in card 1, which corresponds to the signal layer 35 in card 1 in FIG. 4.

Figures 4, 5:
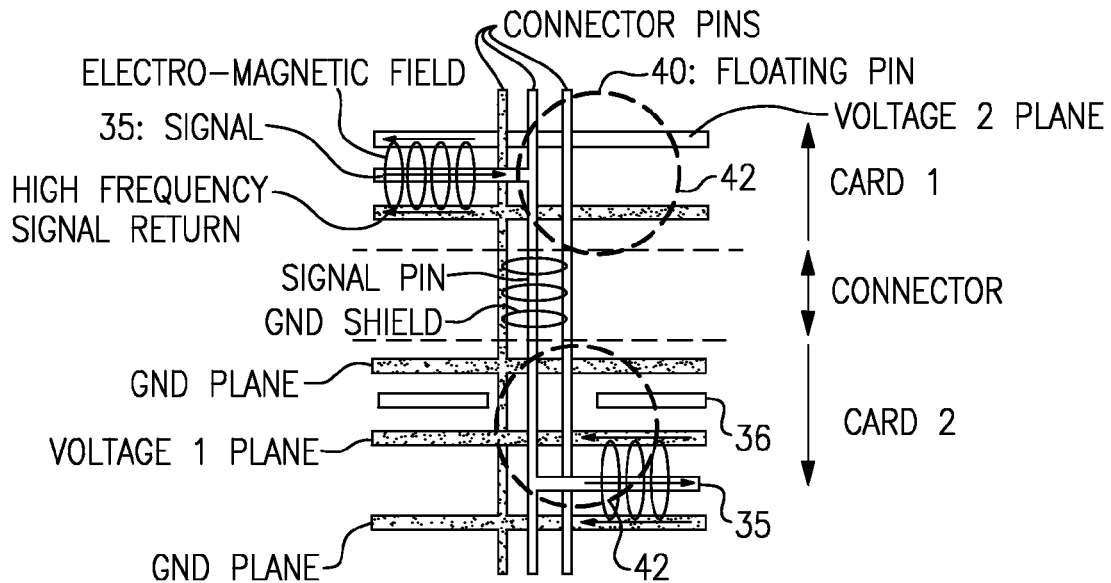
FIG. 4 is a depiction according to FIG. 5 or FIG. 6 illustrating a worst case high frequency signal return path including a floating pin and a resulting high noise coupling.
FIG. 5 is a table representation comparing the measurements of coupled noise in mV at the near end and the far end of the signal wiring.

In contrast to the arrangement in FIG. 4 the inventive embodiment arranges next a further ground plane 630 adjacent to the signal plane 640 in order to build a reference plane pair 630, 650 to increase the signal return of signal 640; remark, that in prior art as given in FIG. 4 a further voltage plane instead of a second ground plane is installed above the signal plane.

According to a preferred feature of the present embodiment above the ground plane 630, and in particular in a region which receives the connector pins from the connector device a so-called "voltage island" is provided, which is denoted with reference sign 625. This voltage island is further described in more detail in FIG. 9 later below. This voltage island 625 is built by a metallized region within a signal layer and carries one of the additionally provided voltages, here denoted as voltage 1, required to be passed between the two cards as mentioned above.

As a person skilled in the art may appreciate, this voltage island 625 can be arranged within the signal plane 620. Signal plane 620 was suppressed in FIG. 4 in order to increase the clarity thereof. To accommodate the signal plane and a voltage island 625 in one and the same layer results in better electrical properties while concurrently keeping the number of layers quite low. Above the voltage island layer 625 a ground plane 610 is arranged.

Figure 11:
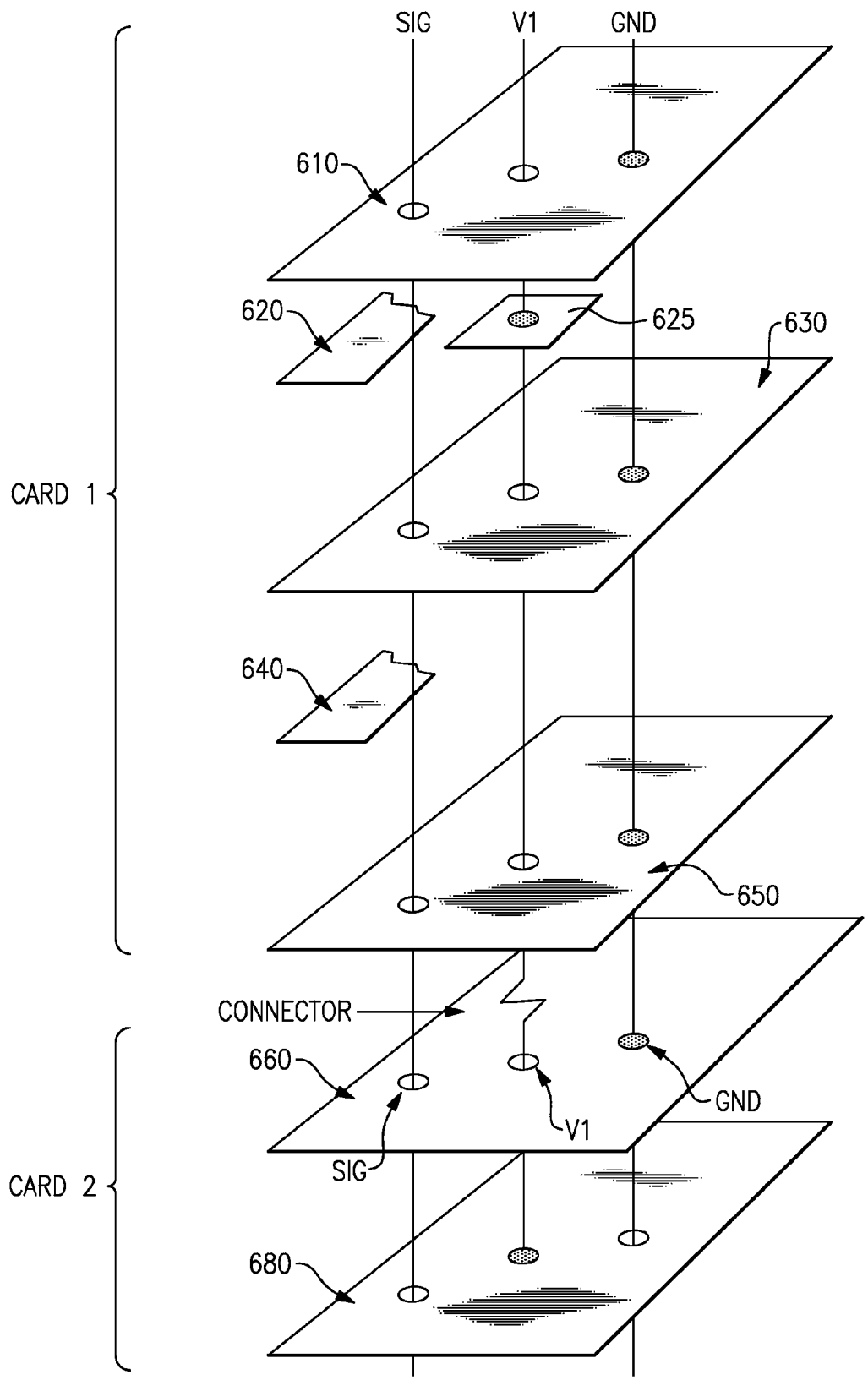
FIG. 11 is a schematic exploded three dimensional perspective view of Card 1 and Card 2 (planes 660 and 680) showing the signal lines and connector of FIG. 8.

FIG. 11 illustrates a schematic exploded three dimensional perspective view of the printed circuit board Card 1 and Card 2 (planes 660 and 680) showing the signal lines and connector of FIG. 8 with the ground plane 610 above the voltage island layer 625 placed within the signal layer 620 located next to the given signal wiring 640.

With reference to the before-mentioned objective of the present invention, to improve the signal return path for the signal pins within the connector and the cards the circle 685 covers a part of the discontinuity region 42 and illustrates the beneficial effect of the voltage island. As a person skilled in the art may appreciate the plane-to-plane capacitance between signal layer 640 and adjacent ground plane 630 is increased by the voltage island provided within the next adjacent signal layer, here signal plane 620. By virtue of this voltage island 625 basically an additional capacitance is installed between ground layer 630 and the voltage island which effects in the intended increased plane to plane capacitance between signal layer 640 and adjacent ground plane 630. This is symbolically depicted within circle 685.

It should be noted that that what is understood by "voltage island" 625 is not a complete plane, as for example ground plane 610, but instead a partial area of a plane and preferably dimensioned such that it covers all those signal connector pins, which may take profit from this additional, increased capacitance. The effect of increasing the plane-to-plane capacitance adjacent to a signal plane also applies to a signal pin within the card connector. This is illustrated by the symbolised electromagnetic field around the signal connector pin in the central portion of the connector in FIG. 8.

Now a short reference is made back to FIG. 4, where the voltage 2 plane is depicted in card 1 and voltage 1 plane is depicted in card 2, and a floating pin 40 is also present in order to exemplarily express a pin 40 having a quite undefined electrical potential (in terms of high frequent signals). By reference of FIG. 4 the problem was discussed how one could manage to optimise the passing of the different voltages from one card to the next.

With reference back now to FIG. 8 it should be added that in FIG. 8 only a voltage island for one voltage plane is depicted, here for voltage 1. Thus, in order to transport a voltage 2 plane from card 1 to card 2, the same construction as illustrated in FIG. 8 for a voltage 1 plane should be preferably repeated at some location at the left side or at the right side of the voltage 1 island in FIG. 8.

Figure 9:
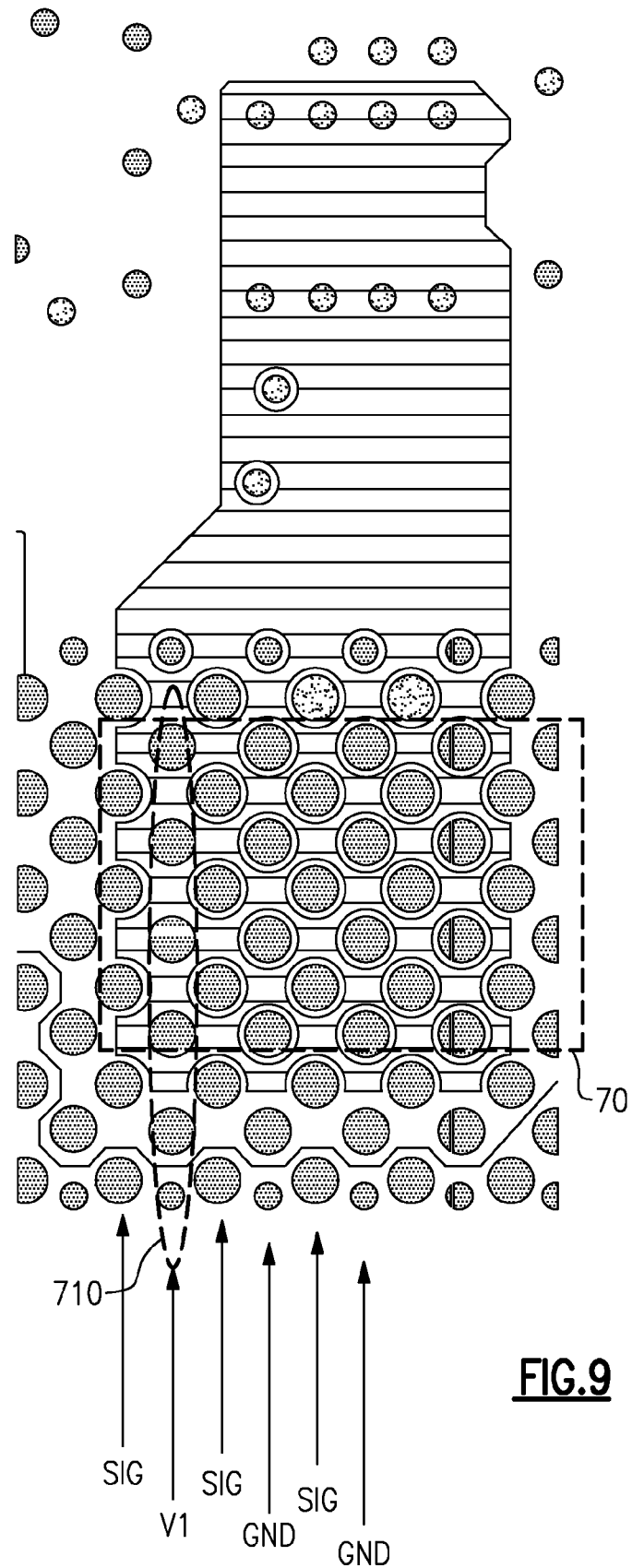
FIG. 9 is a top plan view on a signal layer of card 1, see line 90 in FIG. 8, showing the voltage island in the signal layer and voltage pins connected to the voltage island as well as signal pins and ground pin columns which are connected inside the connector to the internal connector ground shields according to a preferred embodiment of the present invention, wherein the view direction is along the pins, in a schematic, partial form.

Thus, in order to give a more complete overview over that what is meant by the invention, an additional schematic representation is given in FIG. 9. FIG. 9 is a top plan view on a layer in card 1 illustrating a plurality of voltage islands.

With reference to FIG. 9 a top plan view on a voltage island for voltage 1 (denoted as V1) is given in order to increase the clarity of FIG. 8. What reveals from FIG. 9 is that the pins and pin holes are arranged in columns, wherein a column of signal pins is always embedded between a column of ground pins and a column of voltage V1 pins. Thus, the island depicted symbolically in FIG. 9 comprises a number of 6 signal pins in each of the three depicted signal columns. The island is symbolically depicted with a dotted frame 70. The vias which are electrically connected to the depicted layer are located within frame 710.

In a design situation wherein multiple voltages must be transferred from a second card to a first card (or vice versa) within the connector device depicted in the central portion of FIG. 8 a respective plurality of voltage wiring is required to cross the connector device in respective pins and pins holes.

Figure 6:
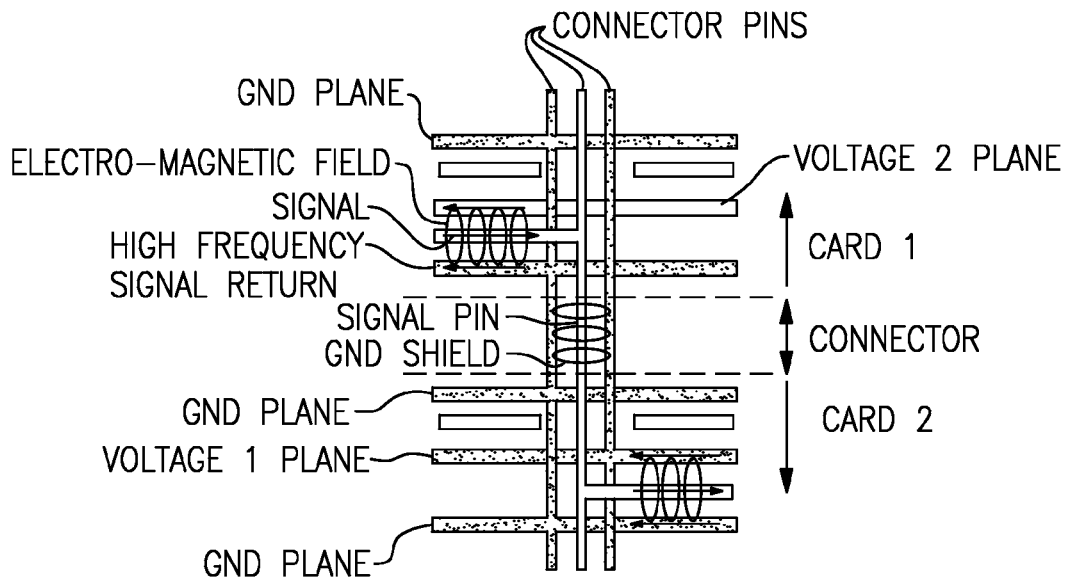
FIG. 6 is a prior art depiction according to FIG. 2 or FIG. 3 illustrating a soft switch for two different voltages resulting in a bad performance signal return path and a high noise coupling.
Figure 7:
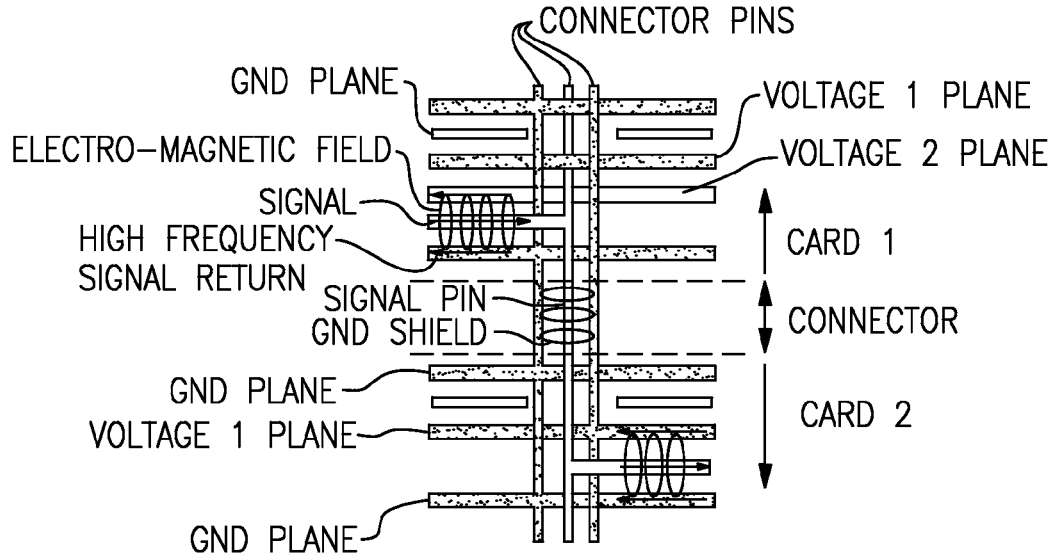
FIG. 7 is a prior art depiction according to FIG. 6 illustrating a prior art high-cost solution for a better signal return path and less coupling.

Defining best the features when departing from FIG. 6, a circuit in accordance to the present invention comprises the card specific reference plane, which can be either voltage or ground, in the present example a ground plane 630 in card 1, instead of the voltage 2 plane in FIG. 6. The voltage 1 is fed from the voltage 1 plane 680 in the second card denoted as card 2, to card 1, where it is distributed within the voltage island 625. The bottom part of FIG. 8 comprising ground plane 660, signal plane 670, the complete voltage 1 plane 680, signal plane 690 and ground plane 695 is the same as that one given in FIG. 6.

Figure 10:
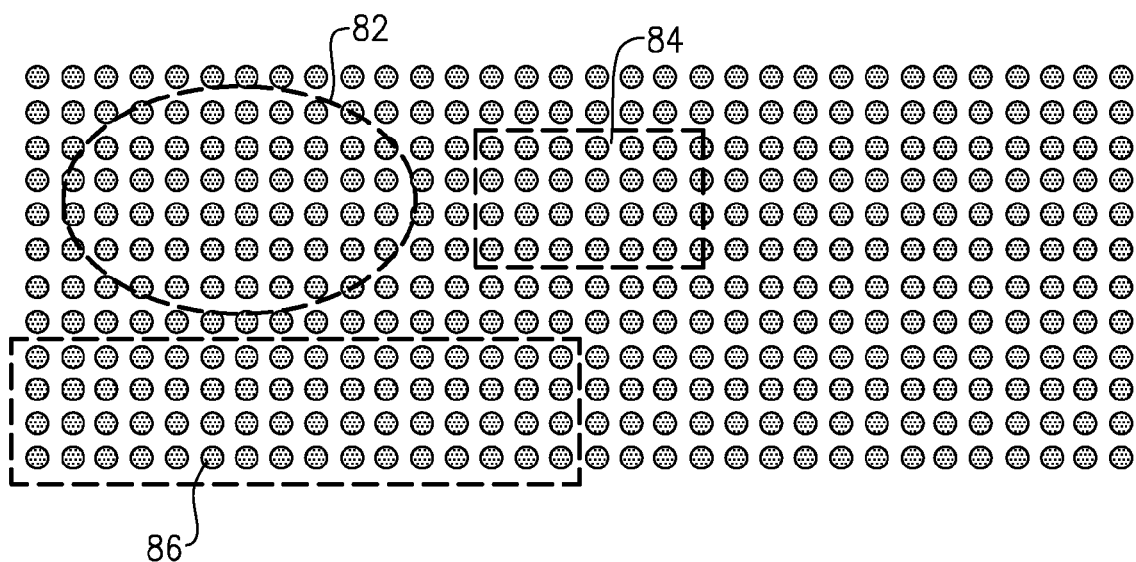
FIG. 10 is a top plan view on a given layer in card 1.

An additional note is given with reference to FIG. 10 for implementing voltage islands for more than a single voltage. FIG. 10 is a top plan view on a part section of a given layer in card 1. As reveals from the drawing three voltage islands 82, 84, 86 are provided carrying different voltage levels, e.g., GND, V1 and V2. The islands do not overlap and cover each a discontinuity region 42 as illustrated in FIG. 4. It should be added that the elliptic form is driven by the motivation that the form can be chosen freely according to the actual needs.

Next, a systematic way is disclosed how a solution is preferably found to close a high frequency signal return path in any desired system design:

In order to meet the required signal performance, the high frequency return paths need to be designed best without a discontinuity. However, special system requirements may cause discontinuity for the high frequency signal return path and therefore also may cause increased signal coupling and signal reflection. In order to minimize the size of the discontinuities and therefore minimize the impact on signal performance a special design method for the second level packages (card and board design) is disclosed next below, comprising the following steps:

Step 1: Determining references (voltages and ground) adjacent to signals in different packaging levels (first package level SCM/MCM, second package level card and board) and components like card to card connectors and vias and pins, solder columns, solder balls and vias in chip level packages. This defines the number of required references for the signals.

Step 2: Determining signals and signal frequency. Separate noise (performance)-critical signals from less critical signals, i.e., low frequency signals. The number of critical signals drives the number of signal layers requiring an adequate reference (voltage and ground planes).

Step 3: Determining card restrictions, as e.g. the intended card thickness. The card thickness restricts the allowed total number of voltage, ground and signal layers. This drives the design solution to reduce or minimize the high frequency signal return path discontinuity.

Step 4: Determining wiring restrictions, in particular the fan out under chip level packages and card connectors, required wiring spacing. This drives the number of required signal layers with an adequate reference (voltage and ground planes).

Step 5: Evaluation of the preceding steps and making the design decision for the card layer stack-up.

The first four steps are driving the decision how many signal layers are needed and what kind of references are required to minimize the high frequency signal return path discontinuity.

In case of very dense wiring with coupled, noise-critical signals all signal layers need to have an appropriate reference. This will drive the usage of single voltage planes, double voltage planes (including two different voltages) or even triple voltage planes including three or more different voltages, wherein the centre plane of the triple can be a split plane, buried between solid voltage planes or ground planes which are adjacent to signal planes.

In case of thickness-restricted cards with just partial critical signals and relaxed wiring in connectors, the adequate design solution is to add voltage islands in signal layers or so called mounting plane layers adjacent to the signal layer of interest, wherein both signal layers are separated by a voltage or ground layer.

The design solution of the preferred embodiment described above can be obtained as a result of this systematic design method.

In step 1 it is showed that different voltages are connected to connector shields adjacent to signal pins. Therefore the appropriate reference needs to be included in the card layer stack-up.

In step 2 it is showed that most of the signals in the signal connector are performance-critical signals; therefore the appropriate references need to be available for all card signal layers. This is essential in order not to limit the wire-ability inside the connector area, especially because the number of signal layers is also restricted.

In step 3 it is showed that the card is limited in thickness. As a result different design options like increased number of split or solid voltage layers adjacent to each signal layer can not be used.

In step 4 it is showed that the wiring is relaxed in the pin rows having different voltages as a reference.

Taking all the collected information (step 1-4) into account, the final design solution is: if a signal is fanned-out in a signal layer, the adjacent two reference planes need to be connected to the primary connector reference (usually ground); in addition one has to add voltage islands, which are connected to the voltage pins, which are adjacent to the signal pins in the connector, in the next adjacent signal layers of the card covering the area of the voltage and signal pins (see FIG. 9).

A person skilled in the art will appreciate that the key to close the signal return path is the step of adding a very good internal plane capacitance with low parasitic properties in form of a voltage plane island to provide a sufficient high frequency signal return path and thus limit the impedance impact and the signal coupling at the discontinuity.

The invention claimed is:

1. A circuit board comprising:
   a first signal plane;
   a second signal plane;
   a first signal connector pin extending through said circuit board, substantially perpendicular to said circuit board;
   a first voltage connector pin;
   a first reference plane disposed parallel and adjacent to said first signal plane, said first reference plane capacitively coupled to one or more signals of said first signal plane;
   a second reference plane, disposed parallel and adjacent to said first signal plane, said second reference plane capacitively coupled to the one or more signals of said first signal plane, said first signal plane disposed in parallel and between said first reference plane and said second reference plane;
   a voltage island electrically connected directly to said first voltage connector pin at said second signal plane, said voltage island capacitively coupled to said second reference plane; and
   wherein said second signal plane is disposed parallel and adjacent to said second reference plane, said second reference plane is disposed in parallel and between said second signal plane and said first signal plane, said second signal plane comprising said voltage island, said voltage island electrically connected directly to said first voltage connector pin at said second signal plane.

2. The circuit board according to claim 1, further comprising a plurality of voltage connector pins electrically connected directly to said voltage island, said plurality of voltage connector pins electrically connected directly to said first voltage connector pin at said second signal plane.

3. The circuit board according to claim 1, further comprising a plurality of ground connector pins electrically connected directly to said first reference plane and said second reference plane.

4. The circuit board according to claim 1, further comprising a direct interconnection of said first voltage connector pin and said first signal connector pin with corresponding connector pins of another circuit board, said another circuit board substantially parallel with said circuit board.

* * * * *